(12) United States Patent
O'Gorman et al.

(10) Patent No.: US 6,940,883 B2
(45) Date of Patent: Sep. 6, 2005

(54) LASER DIODE

(75) Inventors: James Christopher O'Gorman, Dublin (IE); Frederick Paul Logue, Meath (IE)

(73) Assignee: The Provost, Fellows and Scholars of the College of the Holy and Undivided Trinity of Queen Elizabeth, Near Dublin, Dublin (IE)

( * ) Notice: Subject to any disclaimer, the term of this patent is extended or adjusted under 35 U.S.C. 154(b) by 0 days.

(21) Appl. No.: 10/240,390

(22) PCT Filed: Mar. 28, 2001

(86) PCT No.: PCT/IE01/00040

§ 371 (c)(1),
(2), (4) Date: Mar. 5, 2003

(87) PCT Pub. No.: WO01/73906

PCT Pub. Date: Oct. 4, 2001

(65) Prior Publication Data

US 2003/0156612 A1 Aug. 21, 2003

(30) Foreign Application Priority Data

Mar. 28, 2001 (IE) .......................................... S2000/0232

(51) Int. Cl.$^7$ ................................................. H01S 5/00
(52) U.S. Cl. .............................. 372/46; 372/43; 372/44; 372/45; 372/47; 372/48
(58) Field of Search ...................................... 372/43–48

(56) References Cited

U.S. PATENT DOCUMENTS 4,393,504 A    7/1983  Botez
5,438,585 A *  8/1995  Armour et al. ............... 372/45
5,574,818 A *  11/1996 Krivoshlykov ............... 385/122

OTHER PUBLICATIONS

F.P. Logue, et al.; "Transverse Waveguide Design For High–Brightness Laser Diodes"; Physics And Simulation Of Optoelectronic Devices VIII, San Jose, CA, USA Jan. 24–28, 2000, vopl., 2944, pt. 1–2, pp. 387–394, XP001020838, Proceedings Of The SPIE.*

J.A. Patchell et al., "Demonstration fo High–Brightness–Mode Propagation in a Compund Wavequide Structure" Applied Physics Letters, American Institute of Physics. New York, US, vol . . . 15, No. 2, Jul. 12, 1999, pp. 169–171, XP000850756, ISSN: 0003–6951.

F.P. Logue, et al.: "Transverse Waveguide design for high–brightness laser diodes" Physics and Simulation of Optoelectronic Devices VIII, San Jose, CA, USA, Jan. 24–28, 2000, vopl., 3944, pt. 1–2, pp. 387–394, XP001020838, Proceedings of the SPIE.

* cited by examiner

Primary Examiner—Don Wong
Assistant Examiner—Leith A. Al-Nazer
(74) Attorney, Agent, or Firm—Sughrue Mion, PLLC

(57) ABSTRACT

A laser diode (1) for outputting light of a single mode comprises a substrate layer (5), a cladding layer (6) and a compound light propagating layer (7) comprising first, second, third and fourth layers (9 to 12). A wave guiding region (15) of refractive index lower than its adjacent regions is defined by the third layer (11) by two quantum wells (16) positioned at the anti-node of light of a single mode which is propagating in the third layer (11) for propagating and amplifying the single mode light. A central ridge (17) locates the wave guiding region transversely of the direction of light propagation. The wave guiding region (15) can also be defined by shaping the top cladding layer (6) by forming an elongated central channel through the central ridge (17).

21 Claims, 7 Drawing Sheets

LASER DIODE

This is a National stage entry under 35 U.S.C. §371 of Application No. PCT/EP01/00040 filed Mar. 28, 2001; the disclosure of which is incorporated herein by reference.

FIELD OF THE INVENTION

The present invention relates to a laser diode, and in particular, to a semiconductor laser diode for providing light of a single spatial mode. The invention also relates to a method for providing such a laser diode.

BACKGROUND TO THE INVENTION

In optical technology there is a requirement for high power laser diodes with relatively stable single spatial mode bright light output characteristics. Brightness is defined as the optical output power per unit emitting area into unit solid angle from a spatially coherent source with a single lobed emission pattern. Brightness determines the minimum spot size to which light from a source can be efficiently focused. Accordingly, where efficient focusing of laser light is a requirement, for example, in cutting and welding of metal, brightness of the light output of a laser diode is an important property. Furthermore, the brightness of light outputted from a laser diode determines the extent to which the laser output may be coupled to an optical fibre of relatively small diameter. In general, in known high power laser diodes, an increase in optical power output can only be achieved at the expense of emission brightness or in the stability of the light output which in general results in increased beam wander. Single spatial mode waveguide laser diodes provide a relatively stable beam. However, due to the small emission aperture of such laser diodes, the maximum optical power which can be emitted is limited due to the possible onset of facet damage. Unfortunately, while simply increasing the emitting aperture permits higher optical power output, it also results in general, in loss of spatial coherence and brightness. Broad area laser diodes with relatively large emitting apertures which provide higher optical power output also suffer from the disadvantage of lasing in higher order modes and/or a decrease in spatial coherence as a result of the onset of filamentation, and thus the maximum brightness which would otherwise be achieved is limited. Nonetheless, even in broad area laser diodes the optical power output before the onset of optical damage to the laser diode is still limited by optical absorption at the facet. The requirement for spatial coherence in high optical power output laser diodes and the danger of optical damage in narrow aperture laser diodes have been limiting factors in the provision of high optical power output laser diodes for emitting a high intensity optical beam which can be focused to a micrometer size spot of the type typically required for efficient coupling to optical fibres for fibre amplifier applications, and for the production of high optical power densities for cutting, welding and soldering.

There is therefore a need for a laser diode and a method for providing such a laser diode which overcomes these problems.

The present invention is directed towards providing such a laser diode.

SUMMARY OF THE INVENTION

According to the invention there is provided a laser diode for outputting light of a single spatial mode, the laser diode comprising a substrate layer, a cladding layer, and a light propagating layer located between the substrate layer and the cladding layer, wherein a means is provided for defining a wave guiding region in the light propagating layer, the defined wave guiding region being of refractive index lower than an adjacent region in the light propagating layer and being defined in the light propagating layer in a region in which light of the single mode propagates, so that when the defined wave guiding region is pumped the intensity of the light of the single mode is amplified above light of other modes propagated in the light propagating layer.

In one embodiment of the invention the means for defining the wave guiding region comprises a gain means located in the light propagating layer.

In another embodiment of the invention the gain means comprises at least one quantum well located in the light propagating layer. Preferably, the gain means comprises at least two quantum wells located in the light propagating layer. Advantageously, the gain means comprises a plurality of quantum wells located in the light propagating layer.

In one embodiment of the invention the gain means is located in the light propagating layer adjacent an anti-node of the single mode light.

In another embodiment of the invention the wave guiding region is defined in the light propagating layer during growing of the layers of the laser diode.

In a further embodiment of the invention a locating means is provided for locating the wave guiding region in a direction transversely of the direction of light propagation. Preferably, the locating means comprises a longitudinally extending central locating ridge formed on the cladding layer extending in the direction of light propagation for locating and stabilising the wave guiding region in the direction transversely of the direction of light propagation. Advantageously, an electrically conductive layer is provided on the central locating ridge for facilitating pumping of current through the wave guiding region.

In an alternative embodiment of the invention the means for defining the wave guiding region comprises a means in one of the layers adjacent the light propagating layer for reducing the refractive index in a region in the light propagating layer for forming the wave guiding region.

In one embodiment of the invention the means in one of the layers adjacent the light propagating layer for reducing the refractive index in a region in the light propagating layer for forming the wave guiding region comprises a formation in the one of the said layers. Preferably, the formation in the layer adjacent the light propagating layer comprises a longitudinally extending central channel through the said layer extending in the direction of light propagation in the light propagating layer for defining the wave guiding region. Advantageously, the central channel defining the wave guiding region is formed in a longitudinally extending central locating ridge which extends in the direction of light propagation. Preferably, the formation is formed in the cladding layer.

In one embodiment of the invention an electrically conductive layer is formed on the formation in the cladding layer defining the wave guiding region for facilitating pumping of the wave guiding region.

In another embodiment of the invention the means in one of the layers adjacent the light propagating layer for reducing the refractive index in a region in the light propagating layer for forming the wave guiding region comprises a portion which is implanted in the one of the said layers such that the implanted portion is of reduced refractive index to that of the said one of the said layers. Preferably, the implanted portion in the said one of the said layers is electrically conductive. Advantageously, the implanted portion of the said one of the said layers is an elongated portion and extends longitudinally in the direction of light propagation in the light propagating layer for defining the wave guiding region. Preferably, the said implanted portion is formed in the cladding layer.

The invention also provides a method for outputting light of a single spatial mode from a laser diode, wherein the laser diode comprises a substrate layer, a cladding layer, and a light propagating layer located between the substrate layer and the cladding layer, wherein the method comprises defining a wave guiding region in the light propagating layer, the defined wave guiding region being of refractive index lower than an adjacent region in the light propagating layer and being defined in the light propagating layer in a region in which light of the single mode propagates, and pumping a current through the defined wave guiding region so that the intensity of the light of the single mode is amplified above light of other modes propagated in the light propagating layer.

In one embodiment of the invention a gain means located in the light propagating layer for defining the wave guiding region.

In another embodiment of the invention the gain means is provided by at least one quantum well located in the light propagating layer.

In one embodiment of the invention the wave guiding region is located in a transverse direction relative to the direction of light propagation. Preferably, the wave guiding region is located in the direction transversely of the direction of light propagation by a central locating ridge formed on the cladding layer.

In an alternative embodiment of the invention the wave guiding region is defined by providing a means in one of the layers adjacent the light propagating layer for reducing the refractive index in a region in the light propagating layer for forming the wave guiding region.

In one embodiment of the invention the means provided in the said one of the layers adjacent the light propagating layer for reducing the refractive index in a region in the light propagating layer for forming the wave guiding region is provided by a formation being provided in the said one of the said layers.

In another embodiment of the invention the means in one of the layers adjacent the light propagating layer for reducing the refractive index in a region in the light propagating layer for forming the wave guiding region comprises a portion which is implanted in the one of the said layers such that the implanted portion is of reduced refractive index to that of the said one of the said layers.

Advantages of the Invention

The advantages of the laser diodes according to the invention are many. A particularly important advantage of the laser diodes according to the invention is that they provide a high power light output of single spatial mode which is stable. Additionally, the laser diodes according to the invention permit the single mode optical power output to be emitted through an emission area which is greater than laser diodes known heretofore, which thus leads to an emitted beam which is of larger cross-sectional dimensions than can otherwise be achieved. The single spatial mode nature of the emission facilitates fibre coupling to the laser diodes, and provides for a reduction in the size of the minimum spot to which the beam can be focused without loss of intensity. A further advantage of the laser diodes according to the invention is that by virtue of the fact that lasing takes place in the wave guiding region of lower refractive index, optical absorption at the emitting facet is reduced. These, thus, lead to both a high laser efficiency and improved upper emitted power limits before the onset of optical damage at the facet.

A further advantage of the laser diodes according to the invention is that beam wander of the laser light output is restricted due to the discrimination against lasing in the lower order modes of the light propagating layers which in the case of the laser diode of one embodiment of the invention is determined by the placement of the gain means, in other words, the electrical current pumped quantum wells, and the consequent high confinement factors of the lasing mode.

The invention will be more clearly understood from the following description of some preferred embodiments thereof, which are given by way of example only, with reference to the accompanying drawings.

BRIEF DESCRIPTION OF THE DRAWINGS

FIG. 7 is a perspective view of a laser diode according to another embodiment of the invention.

DETAILED DESCRIPTION OF THE INVENTION

Figure 1:
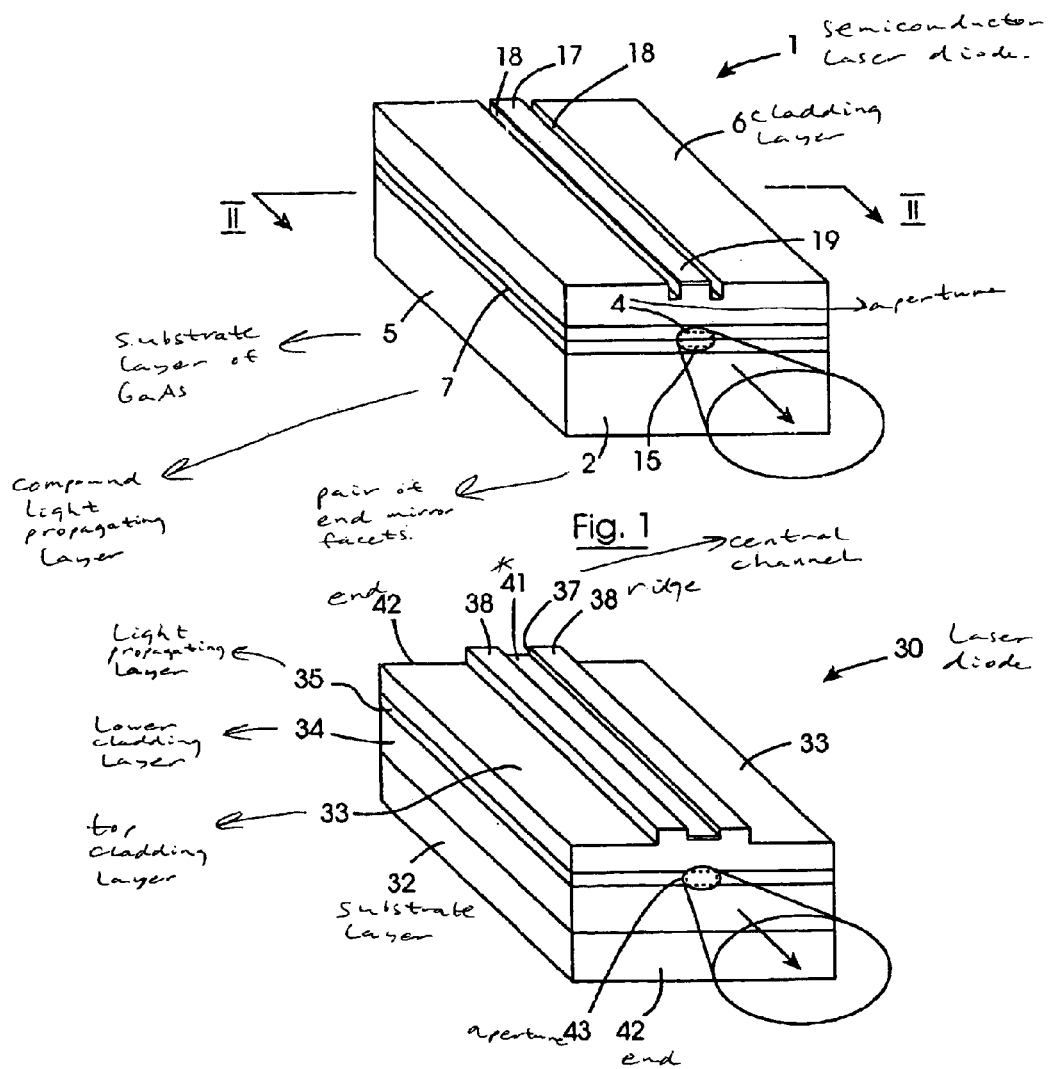
FIG. 1 is a perspective view of a laser diode according to the invention.
Figure 2:
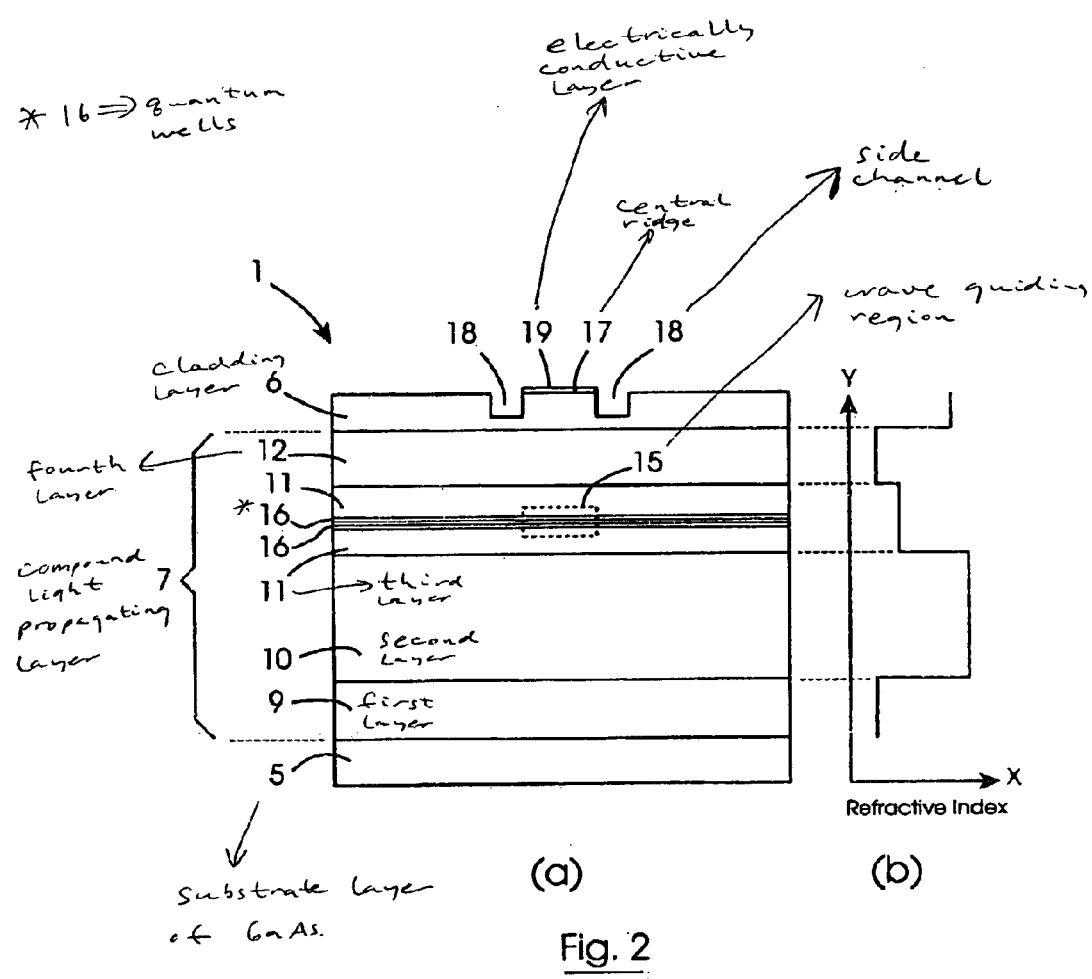
FIG. 2(a) is a transverse cross-sectional end elevational view of the laser diode of FIG. 1 on the line II—II of FIG. 1.
FIG. 2(b) is a graphical representation of the refractive index profile of respective layers of the laser diode of FIG. 1.

Referring to the drawings and initially to FIGS. 1 to 6 thereof, there is illustrated a semiconductor laser diode according to the invention indicated generally by the reference numeral 1 for outputting a high power single mode light beam. The laser diode 1 extends longitudinally between a pair of mirror end facets 2 formed when the laser diode 1 is cleaved from a semiconductor wafer, at least one of which ends defines an aperture 4 through which the single mode light is outputted. The laser diode 1 comprises a substrate layer 5 of GaAs and a cladding layer 6. A compound light propagating layer 7 is located between the substrate layer 5 and the cladding layer 6 and comprises a plurality of layers which are sequentially grown on the substrate layer 5, namely, a first layer 9, a second layer 10, a third layer 11 and a fourth layer 12, see FIG. 2(a). The first layer 9 is of depth 2 μm while the fourth layer 12 is of 1.3 μm depth, and both are of $Al_{0.30}Ga_{0.70}As$. The second layer 10 is of depth 3.15 μm and is of GaAs. The third layer 11 is of depth 1.2 μm and is of $Al_{0.27}Ga_{0.73}As$. The refractive index of the second layer 10 is relatively high, having a refractive index of approximately 3.52, see FIGS. 2(b) and 3. The refractive index of the third layer 11 is deliberately chosen to be low at approximately 3.38, and the highest intensity anti-node of the light of a single spatial mode is propagated in the third layer 11. The wave guiding properties of the light propagating layer 7 are predetermined by virtue of the material and depth of the first to the fourth layers 9 to 12, and light of a desired single mode is guided in the third layer 11.

A means for defining a wave guiding region 15 in the third layer 11 within which the light of a single mode is guided, and for amplifying the intensity of the single mode light in the wave guiding region 15 comprises a gain means, which in this embodiment of the invention is provided by two quantum wells 16 which are formed in the third layer 11 of InGaAs. The quantum wells 16 are located in the third layer 11 at a position at which the highest order mode of the single mode light occurs, and at the anti-node of the single mode light, so that the highest order mode is propagated and amplified as the dominant mode in the wave guiding region 15 in preference to the other modes of the light propagating layer 7. As well as locating the quantum wells 16 at the position where the anti-node of the highest order mode occurs, the quantum wells 16 are located in such a way as to ensure that the highest order mode has the largest overlap with the quantum wells 16. This overlap is known as the confinement factor Γ for the propagating single mode light.

A locating means for locating the wave guiding region 15 transversely relative to the direction of light propagation comprises an elongated central locating ridge 17 which extends longitudinally along the cladding layer 6 in the direction of light propagation. A pair of spaced apart side channels 18 formed in the cladding layer 6 form the central ridge 17. An electrically conductive layer 19 is laid down on the central ridge 17 for facilitating pumping of a pumping electrical current through the laser diode 1.

Figure 3:
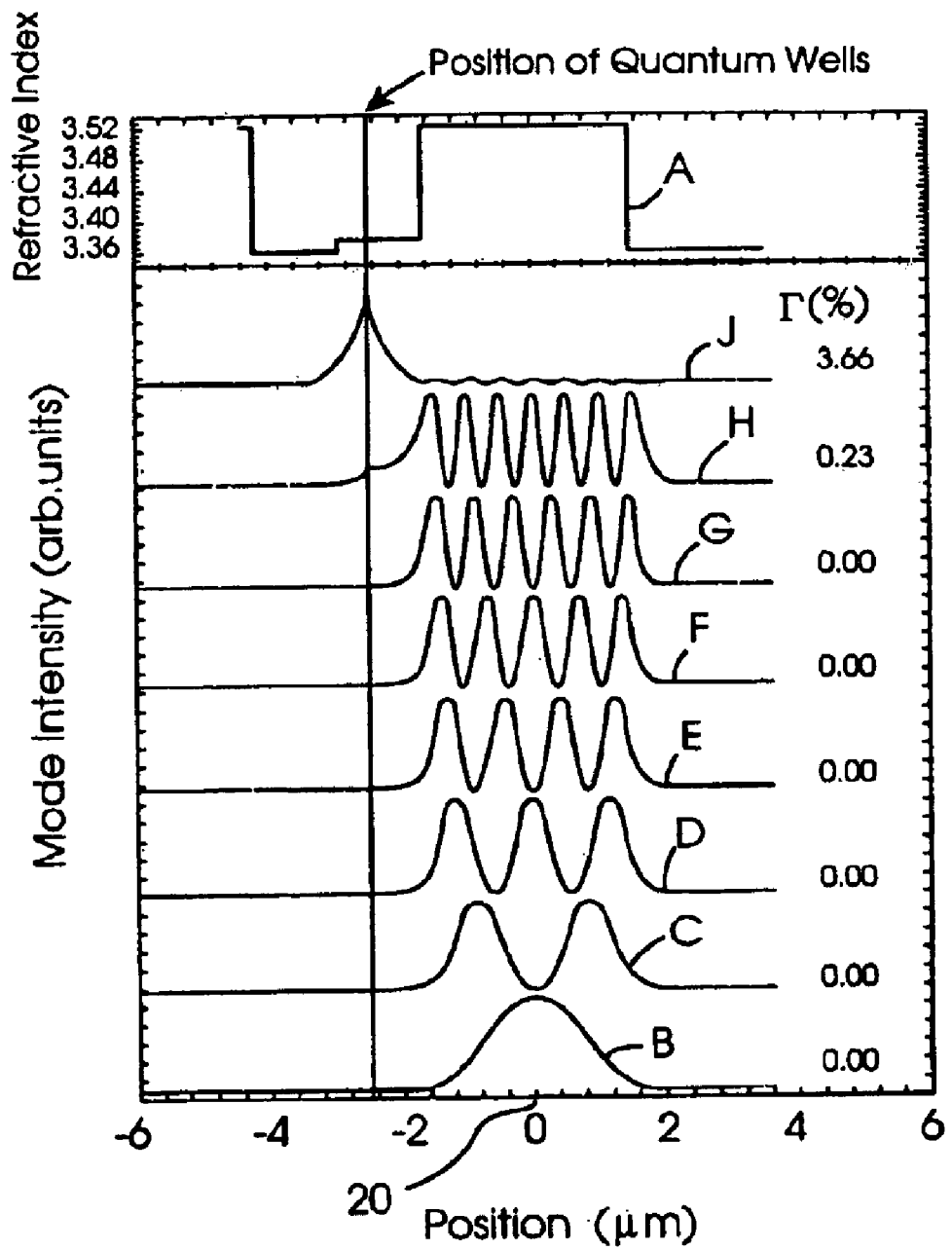
FIG. 3 illustrates waveforms of optical modes generated in the laser diode of FIG. 1.

Referring now to FIG. 3, waveform A is a plot of the refractive indices of the light propagating layer 7 and the cladding layer 6 which is plotted against distance from a centre point 20 of the first layer 9. In other words, the waveform A of FIG. 3 is similar to the graphical representation of the refractive indices of the light propagating layer 7 and the cladding layer 6 of FIG. 2(b). Waveforms B to H of FIG. 3 illustrate the intensities which are plotted in arbitrary units of the modes of the light propagated in the first and second layers 9 and 10 of the compound light propagating layer 7. Waveform J illustrates the intensity of the highest order mode also plotted in arbitrary units which is propagated in the wave guiding region 15 adjacent the quantum wells 16. The confinement factors relative to the various modes of light are indicated in the right-hand column, and as can be seen, the confinement factor Γ resulting from the quantum wells 16 in the wave guiding region 15 is 3.36%, which thus ensures significant amplification of the highest order mode at the expense of the other remaining modes. The value of the confinement factor Γ for the single mode light illustrated by the waveform J which has an anti-node with which the quantum wells 16 coincide is significantly higher than the value of the confinement factor Γ for any of the other modes in the first and second layers 9 and 10. In fact, as can be seen, the next confinement factor Γ below the confinement factor Γ of the highest order single mode light is 0.23%, which is more than a factor of ten less than the confinement factor of 3.66% of the highest order single mode light.

The region 15 which is of lower refractive index than that of the second layer 10 in the Y direction, see FIG. 2(a), perpendicular to the direction of light propagation, namely, in the direction of growth of the layers 9 to 12 of the light propagating layer 7 in this embodiment of the invention is determined by the actual refractive index of the material of the wave guiding region 15. The central ridge 17 increases the refractive index of the third layer 11 beneath the central ridge 17 thereby centrally locating the wave guiding region 15 beneath the central ridge 17 in the X direction perpendicular to the Y direction, and also perpendicular to the direction of light propagation in the wave guiding region 15.

Figure 4:
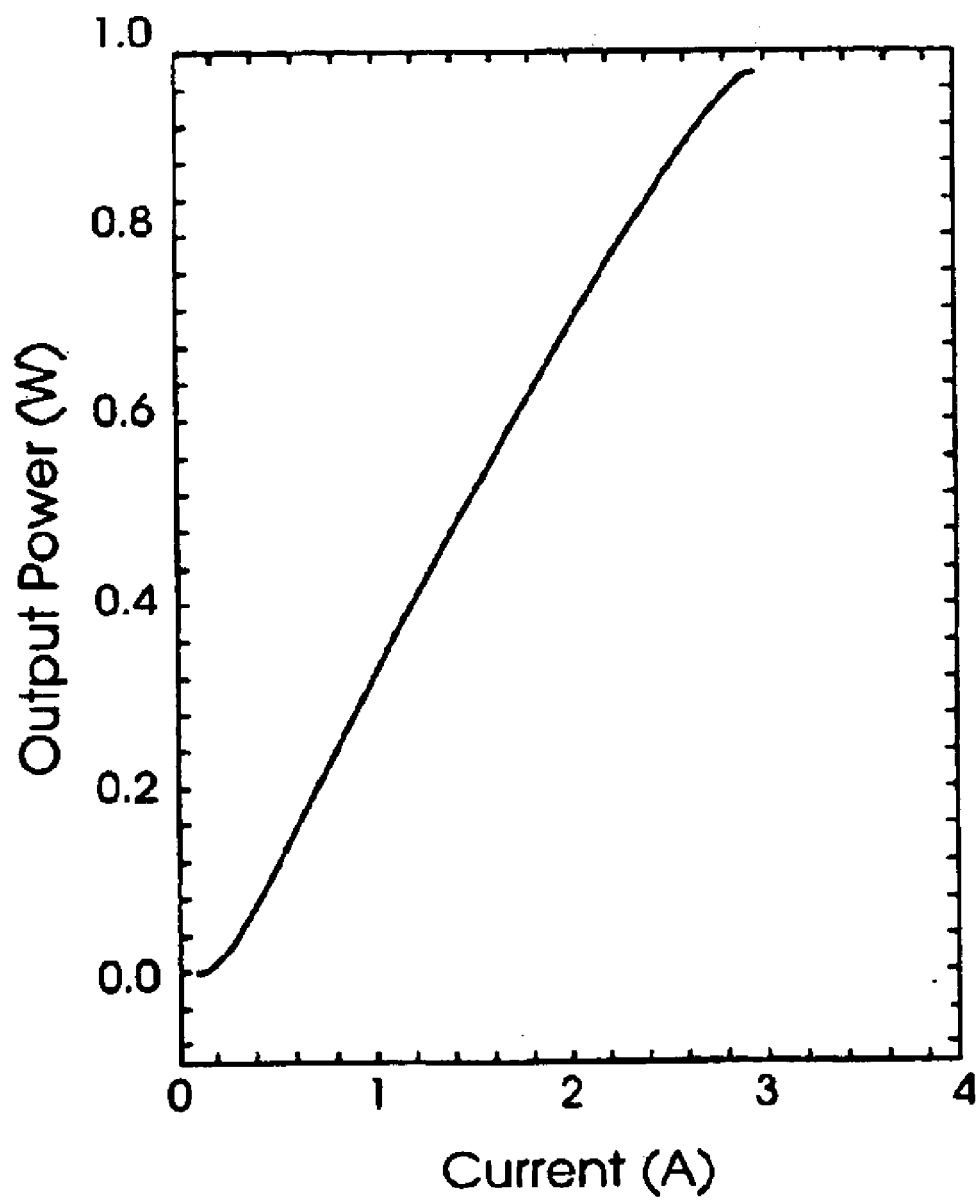
FIG. 4 illustrates a waveform of light output plotted against current for the laser diode of FIG. 1.

In this embodiment of the invention the central ridge 17 formed in the cladding layer 6 is 50 μm wide in the X direction, and the laser diode is cleaved to a length in the direction of light propagation of approximately 1,000 μm. The laser diode 1 has a threshold current of approximately 170 mA corresponding to a threshold current density of $340 A/cm^2$ or $170 A/cm^2$ for each quantum well 12. The low threshold current of the laser diode 1 provides for operation in a mode with large overlap between it and the gain medium. FIG. 4 illustrates a waveform of output optical power in Watts plotted against current in Amps.

Figure 5:
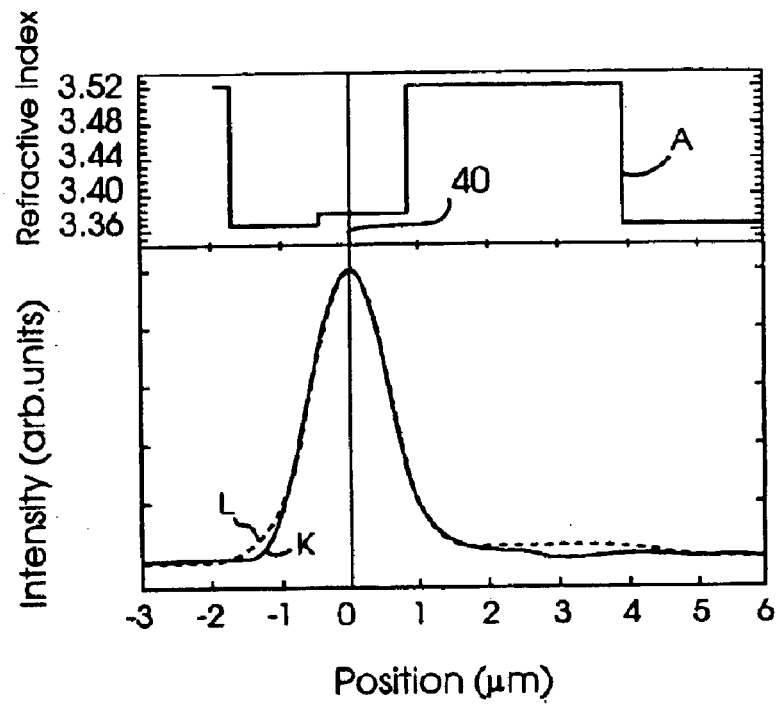
FIG. 5 illustrates waveforms which show a comparison between the measured and calculated near field light emission pattern of the laser diode of FIG. 1.

Referring now to FIG. 5, two waveforms of the near field emission intensity pattern of the light of the laser diode 1 in arbitrary units plotted against distance in the Y direction, namely in the direction of growth of the layers of the light propagating layer 7 are illustrated with the zero point on the X axis taken as the position of the quantum wells 12 in the light propagating layer 7. The waveform A illustrated by a continuous line is the theoretical calculated value of the light intensity of the near field emission pattern, while the waveform B illustrated by a broken line is the measured light intensity of the near field emission pattern. As can be seen the experimentally measured near field emission pattern agrees with the calculated pattern, demonstrating that in this embodiment of the invention the laser mode propagating in the laser wave guide is preferentially confined to the low index wave guiding region defined in the direction of growth of the laser diode.

Figure 6:
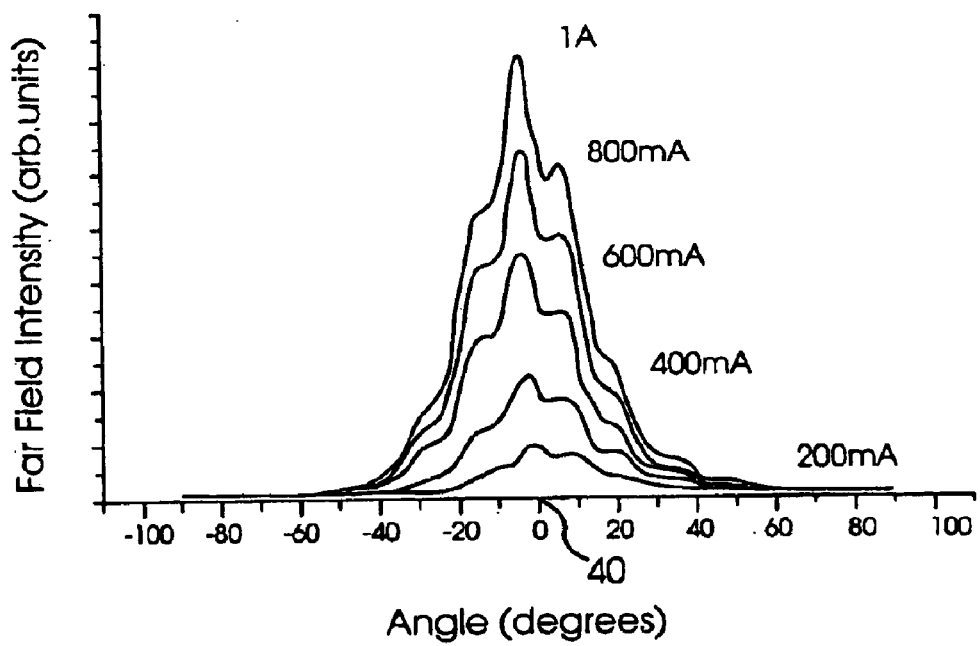
FIG. 6 illustrates waveforms of far field light emission patterns in the direction parallel to the growth direction for the laser diode of FIG. 1 for various laser operating currents.

FIG. 6 illustrates waveforms of light intensity in arbitrary units of the far field emission patterns plotted against angles in degrees for several operating currents from 200 mA to 1A. The zero angle position is arbitrary. The waveforms demonstrate that for this wide range of operating conditions the position and shape of the emitted mode is stable and does not exhibit beam wander. The laser diode 1 when operating at a current of 1A provides an optical power output of 300 mW, approximately. From a comparison of FIGS. 5 and 6, it can be seen that there is little change in the far field caused by increasing current output, and thus, the laser diode according to the invention provides a highly stable optical output.

Figure 8:
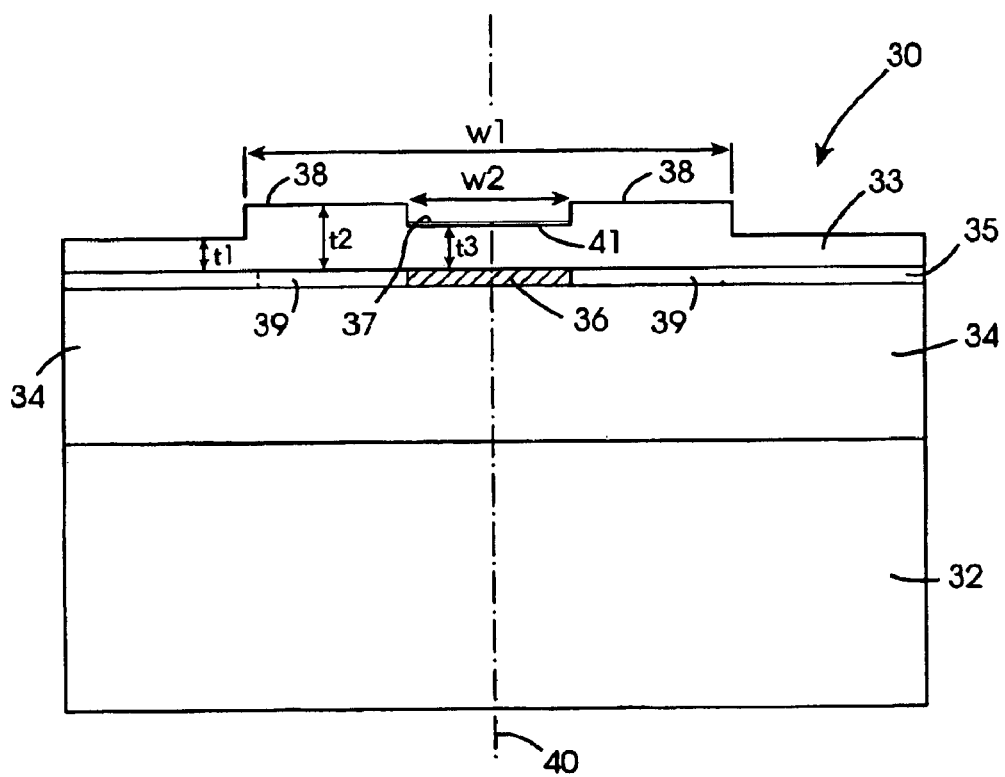
FIG. 8 is a transverse cross-sectional end elevational view similar to that of FIG. 2(a) of a laser diode according to another embodiment of the invention.
Figure 9:
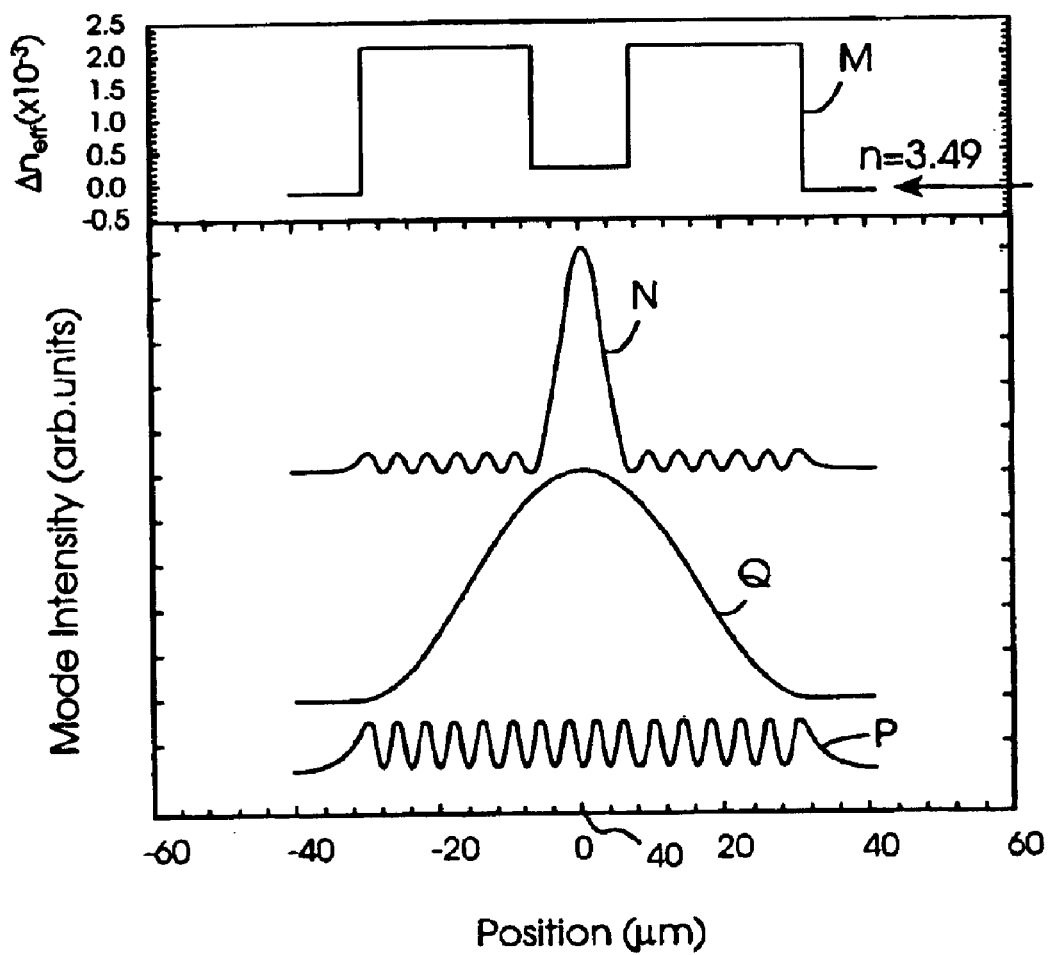
FIG. 9 illustrates waveforms of intensity of light output of the laser diode of FIGS. 7 and 8 and a conventional laser diode for comparison purposes.

Referring now to FIGS. 7 to 9, there is illustrated a laser diode 30 also according to the invention. In this embodiment of the invention the laser diode 30 comprises a substrate layer 32, a top cladding layer 33 and a lower cladding layer 34. A light propagating layer 35 is located between the top cladding layer 33 and the lower cladding layer 34. However, in this embodiment of the invention the means for defining a wave guiding region 36 in the light propagating layer 35 comprises a formation in the top cladding layer 33, namely, a longitudinally extending central channel 37 extending in the direction of light propagation which is formed in a central locating ridge 38 in the top cladding layer 33. The central channel 37 defines the wave guiding region 36 to be of lower refractive index than the adjacent regions in the light propagating layer 35 in the X axis direction. An electrically conductive layer 41 is provided on the surface of the bottom of the central channel 37 for facilitating pumping a current through the wave guiding region 36. The central channel 37 effectively acts as a gain means for amplifying light propagating in the wave guiding region 36 in preference to other modes propagating in the light propagating layer 35. The central ridge 38 determines an active region 39 in the light propagating layer 36 in the X axis direction transversely of the direction of light propagation in the light propagating layer 35, while the central channel 37 defines the low refractive wave guiding region 36 in the X axis direction. The laser diode 30 extends between cleaved ends 42 one of which defines an aperture 43 through which the single mode light is outputted.

Referring now to FIG. 9, waveform M illustrates the refractive indices of the light propagating layer 35 in the X direction with the zero point 40 of the X axis corresponding to the centre of the central channel 37 in the X direction. The graph N is a plot of the light intensity of the highest order mode which propagates in the wave guiding region 36 in the X direction against distance from the centre point 40 of the central channel 37. For the purpose of comparison, the light intensity plotted in arbitrary units against distance from the centre point of a wave guiding layer 35 of a laser diode which is similar to the laser diode 30 but with the exception that the central channel 37 has been omitted are illustrated by the waveforms P and Q. In such a laser diode the effective refractive index of the light propagating layer which corresponds to the light propagating layer 35 is constant, and higher than the effective refractive index of the cladding layer, and thus the lowest order mode which is illustrated by the graph Q gives a relatively broad lobed emission, while the highest order modes are attenuated relative to the lowest order mode, see waveform P. Accordingly, it can be seen that by providing the central channel 37 for reducing the effective refractive index of the light propagating layer 35 to define the wave guiding region 36 causes the highest order mode to be largely confined beneath the central channel 37, thus giving a predominantly single lobed emission from the laser diode.

Table 1 sets out the materials, depths and refractive indices of the respective substrate layer 32, the lower cladding layer 34, the light propagating layer 35 and the top cladding layer 33 of the laser diode 30. Table 2 sets out the depths T1 to T3 of the top cladding layer 33 and the width W1 of the central ridge 38 and the width W2 of the central channel 37.

TABLE 1

Details of the layer structure of the laser diode 30

| Layer | Material | Depth ($\mu$m) | Refractive index ($\lambda$ - 989 nm) |
|---|---|---|---|
| Substrate | GaAs | — | 3.5253 |
| Lower Cladding Layer | Al$_{0.3}$Ga$_{0.7}$As | 2.0 | 3.3603 |
| Wave Guiding Layer | GaAs | 0.3 | 3.5253 |
| Top Cladding Layer | Al$_{0.3}$Ga$_{0.7}$As |  | 3.3603 |

TABLE 2

Dimensions of top cladding layer of the laser diode 30

| Dimension | $\mu$m |
|---|---|
| t1 | 0.250 |
| t2 | 0.750 |
| t3 | 0.265 |
| w1 | 61 |
| w2 | 15 |

While laser diodes of layers of specific materials and specific dimensions have been described, it will be readily apparent to those skilled in the art that laser diodes according to the invention may be provided with layers of other materials and other dimensions.

While in the embodiment of the invention described with reference to FIGS. 7 to 9 the means for defining the wave guiding region 36 is provided by a formation 37 in the cladding layer 33, it is envisaged that the means for defining the wave guiding region may be provided by other means. One such means for forming the wave guiding region would be to implant a longitudinally extending portion of the cladding layer so that the implanted portion would extend longitudinally in the direction of light propagation, and in implanting the portion of the cladding layer, the refractive index of the implanted portion would be reduced. Additionally, the implanted portion may be made electrically conductive for pumping the wave guiding region. It is envisaged that the cladding layer 33 could be provided as GaAsAlAs in the form of a super lattice. The elongated portion of the cladding layer extending in the direction of light propagation would then be implanted with zinc, which would thus form an electrically conductive portion of reduced refractive index. This would have a substantially similar effect in forming the elongated channel 37 in the cladding layer 33 as described in the embodiment of the invention with reference to FIGS. 7 to 9.

What is claimed is:

1. A laser diode for outputting light of a single spatial high order mode, the laser diode comprising:
    a substrate layer,
    a cladding layer,
    a light propagating layer located between the substrate layer and the cladding layer, and
    a gain means comprising at least one quantum well provided in the light propagating layer for defining a wave guiding region therein,
    a means being provided in one of the layers adjacent the light propagating layer for reducing the refractive index of the defined wave guiding region to be lower than the refractive index of an adjacent region in the light propagating layer in order that light of the highest order single spatial mode is propagated in the defined wave guiding region, so that when the defined wave guiding region is pumped the intensity of the light of the highest order single spatial mode is amplified above light of other lower order modes propagated in the light propagating layer.

2. A laser diode as claimed in claim 1 in which the gain means comprises at least two quantum wells located in the light propagating layer.

3. A laser diode as claimed in claim 1 in which the gain means comprises a plurality of quantum wells located in the light propagating layer.

4. A laser diode as claimed in claim 1 in which the wave guiding region is defined in the light propagating layer during growing of the layers of the laser diode.

5. A laser diode as claimed in claim 1 in which the means in one of the layers adjacent the light propagating layer for reducing the refractive index in a region in the light propagating layer for forming the wave guiding region comprises a portion which is implanted in the one of the said layers such that the implanted portion is of reduced refractive index to that of the said one of the said layers.

6. A laser diode as claimed in claim 1 in which the means in one of the layers adjacent the light propagating layer for reducing the refractive index in a region in the light propagating layer for forming the wave guiding region comprises a formation in the one of the said adjacent layers.

7. A laser diode as claimed in claim 6 in which the formation is formed in the cladding layer.

8. A laser diode as claimed in claim 6 in which the formation in the layer adjacent the light propagating layer comprises a central channel extending longitudinally through the said adjacent layer in the direction of light propagation in the light propagating layer for defining the wave guiding region.

9. A method for outputting light of a single spatial high order mode from a laser diode, wherein the laser diode comprises a substrate layer, a cladding layer, and a light propagating layer located between the substrate layer and the cladding layer, the method comprising the steps of:
providing a gain means comprising at least one quantum well in the light propagating layer for defining a wave guiding region therein,
providing a means in one of the layers adjacent the light propagating layer for reducing the refractive index of the defined wave guiding region to be lower than the refractive index of an adjacent region in the light propagating layer in order that light of the highest order single spatial mode is propagated in the defined wave guiding region, and
pumping a current through the defined wave guiding region so that the intensity of the light of the highest order single spatial mode is amplified above light of other modes propagated in the light propagating layer.

10. A method as claimed in claim 9 in which the gain means is provided by at least two quantum wells located in the light propagating layer.

11. A method as claimed in claim 9 in which the gain means is provided by a plurality of quantum wells located in the light propagating layer.

12. A method as claimed in claim 9 in which the wave guiding region is defined in the light propagating layer during growing of the layers of the laser diode.

13. A method as claimed in claim 9 in which the means in one of the layers adjacent the light propagating layer for reducing the refractive index in a region in the light propagating layer for forming the wave guiding region comprises a portion which is implanted in the one of the said layers such that the implanted portion is of reduced refractive index to that of the said one of the said layers.

14. A method as claimed in claim 9 in which the means provided in the said one of the layers adjacent the light propagating layer for reducing the refractive index in a region in the light propagating layer for forming the wave guiding region is provided by a formation being provided in the said one of the said adjacent layers.

15. A method as claimed in claim 14 in which the formation is formed in the cladding layer, and an electrically conductive layer is formed on the formation in the cladding layer defining the wave guiding region for facilitating pumping of the wave guiding region.

16. A method as claimed in claim 14 in which the formation in the layer adjacent the light propagating layer comprises a channel extending longitudinally through the said adjacent layer in the direction of light propagation in the light propagating layer for defining the wave guiding region.

17. A laser diode for outputting light of a single spatial high order mode, the laser diode comprising:
a substrate layer,
a cladding layer,
a light propagating layer located between the substrate layer and the cladding layer, and
a gain means for defining a wave guiding region in the light propagating layer, the defined wave guiding region being of refractive index lower than an adjacent region in the light propagating layer and being defined in a region of the light propagating layer adjacent an anti-node of the highest order single spatial mode light propagated in the light propagating layer, so that when the defined wave guiding region is pumped the intensity of the light of the highest order single spatial mode is amplified above light of other lower order modes propagated in the light propagating layer.

18. A method for outputting light of a single spatial high order mode from a laser diode, wherein the laser diode comprises a substrate layer, a cladding layer, and a light propagating layer located between the substrate layer and the cladding layer, the method comprising the steps of:
providing a gain means in the light propagating layer for defining a wave guiding region therein, the defined wave guiding region being of refractive index lower than an adjacent region in the light propagating layer and being defined in a region of the light propagating layer adjacent an anti-node of the highest order single spatial mode light propagated in the light propagating layer, and
pumping a current through the defined wave guiding region so that the intensity of the light of the highest order single spatial mode is amplified above light of other modes propagated in the light propagating layer.

19. A laser diode for outputting light of a single spatial high order mode, the laser diode comprising:
a substrate layer,
a cladding layer,
a light propagating layer located between the substrate layer and the cladding layer,
a gain means comprising at least one quantum well provided in the light propagating layer for defining a wave guiding region therein, the defined wave guiding region being of refractive index lower than an adjacent region in the light propagating layer and being defined in the light propagating layer in a region in which light of the highest order single spatial mode is propagated, so that when the defined wave guiding region is pumped the intensity of the light of the highest order single spatial mode is amplified above light of other lower order modes propagated in the light propagating layer, and
a locating means for locating the wave guiding region in a direction transversely of the direction of light propagation.

20. A laser diode as claimed in claim 19 in which the locating means comprises a longitudinally extending central locating ridge formed on the cladding layer extending in the direction of light propagation for locating and stabilising the wave guiding region in the direction transversely of the direction of light propagation, an electrically conductive layer being provided on the central locating ridge for facilitating pumping of current through the wave guiding region.

21. A method for outputting light of a single spatial high order mode from a laser diode, wherein the laser diode comprises a substrate layer, a cladding layer, and a light propagating layer located between the substrate layer and the cladding layer, the method comprising the steps of:

providing a gain means comprising at least one quantum well in the light propagating layer for defining a wave guiding region therein, the defined wave guiding region being of refractive index lower than an adjacent region in the light propagating layer and being defined in the light propagating layer in a region in which light of the highest order single spatial mode is propagated, forming a central locating ridge on the cladding layer for locating the wave guiding region in a direction transversely of the direction of light propagation, forming an electrically conductive layer on the central locating ridge for facilitating pumping of current through the wave guiding region, and pumping a current through the defined wave guiding region through the electrically conductive layer so that the intensity of the light of the highest order single spatial mode is amplified above light of other modes propagated in the light propagating layer.

* * * * *